(12) United States Patent
Tsai et al.

(10) Patent No.: US 7,553,733 B2
(45) Date of Patent: Jun. 30, 2009

(54) ISOLATED LDMOS IC TECHNOLOGY

(75) Inventors: Ming-Ren Tsai, Sanchong (TW); Chen-Fu Hsu, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 9 days.

(21) Appl. No.: 11/696,345

(22) Filed: Apr. 4, 2007

(65) Prior Publication Data

US 2007/0181919 A1 Aug. 9, 2007

Related U.S. Application Data

(62) Division of application No. 10/910,178, filed on Aug. 3, 2004, now Pat. No. 7,224,025.

(51) Int. Cl.
*H01L 21/331* (2006.01)

(52) U.S. Cl. .................. 438/306; 439/307; 439/197

(58) Field of Classification Search ............. 438/197, 438/306, 307
See application file for complete search history.

(56) References Cited

U.S. PATENT DOCUMENTS

2005/0285189 A1* 12/2005 Shibib et al. ............... 257/341

* cited by examiner

*Primary Examiner*—Long Pham
(74) *Attorney, Agent, or Firm*—Tung & Associates

(57) ABSTRACT

A lateral double diffused metal oxide semiconductor (LDMOS) device includes a gate to control the device, a drain coupled to the gate formed in a well of a first type, a source to form a current path with the drain, and a first field oxide region disposed between the gate and the drain. The gate is formed over a first portion of the well of the first type and a channel portion of the well of the second type. The LDMOS also includes a second field oxide region, which is disposed between the edges of the drain and the well of the second type. A dummy polysilicon layer, which is formed to cover approximately one half of the second field oxide with a remaining portion of the dummy polysilicon layer covering a second portion of the well of the second type, reduces the electric field in the drift region.

20 Claims, 3 Drawing Sheets

ISOLATED LDMOS IC TECHNOLOGY

This is a divisional of application(s) Ser. No. 10/910,178 filed on Aug. 3, 2004 now U.S. Pat. No. 7,224,025 which designated the U.S.

BACKGROUND

The present invention relates generally to semiconductor devices and particularly to improving lateral double diffused metal oxide semiconductor (LDMOS) devices.

LDMOS are well known devices, which form an integral part of modern day display panels, telecommunication systems, motor controllers, switch lock power supplies, inverters, and alike, designed for low on-resistance and high blocking voltage. The high voltage (HV) characteristics associated with these applications require that the LDMOS devices have the capacity to withstand voltages, which may vary from about 5V to about 1000V without exhibiting breakdown.

LDMOS devices are field effect transistor (FET) devices which bear a certain resemblance to conventional FET devices insofar as they include a pair of source/drain regions formed within a semiconductor substrate and separated in part by a channel region also formed within the semiconductor substrate, the channel region in turn having formed thereover a gate electrode. However, LDMOS devices differ from conventional FET devices in part insofar as while a pair of source/drain regions within a FET device is typically fabricated symmetrically with respect to a gate electrode within the FET device, within a LDMOS device a drain region is formed further separated from a gate electrode than a source region, and the drain region is additionally formed within a doped well (of equivalent polarity with the drain region) which separates the drain region from the channel region.

An LDMOS device is basically an asymmetric power MOSFET fabricated using a double diffusion process with coplanar drain and source regions. The low on-resistance and high blocking voltage features of the LDMOS are obtained by creating a diffused P-type channel region in a low-doped N-type drain region. The source and drain regions are on the laterally opposing sides of the gate area. The concentrations of doping are denoted by N− and N+ for n-doped material (n-material), and by P+ and P− for p-doped material (p-material). The low doping on the drain side results in a large depletion layer with high blocking voltage. The channel region diffusion can be defined with the same mask as the source region, resulting in a short channel with high current handling capability. The device may be fabricated by diffusion as well as ion implantation techniques.

A typical structure of an LDMOS device 100, according to the prior art is shown in FIG. 1. N-well of silicon 112 is isolated from P-well 111 by boundaries 113. P-well 111 extends downwards from the top surface and includes N+regions 117 whose distance L 110 from the junction between P-well 111 and N-well 112 defines the channel. The N+regions 117 provide both source 125 and drain 130 contact regions. With the application of positive voltage $V_G$ polysilicon gate 116 (beneath which is a layer of gate oxide not explicitly shown), current can flow through the channel from the source 125 into N+ 117, into P-well 111, and into N- well 112 to be collected at N+ 117 by the drain 130. Metal contact 115 shorts N+ 117 to P+ohmic contact 119. This allows source current to be applied through the P-well 111 which can then be cooled through a heat sink. Most LDMOS structures are built on a substrate having one or more other device structures. These devices are isolated by utilizing field oxide (FOX) processes or shallow trench isolation (STI) regions. The role of FOX regions 114 in HV applications is to provide isolation and improve breakdown voltage by reducing electric field density.

Presently, many HV LDMOS devices include a wide drift region (N/P well) having a length D 120 that is required to isolate cool drain (high voltage) and hot well (GND). The typical value of D 120, which is measured from an edge of the drain 130 to the boundary 113 of the N/P well, is set as 5 microns (μm) to prevent high voltage drain 130 punch through to the base guard ring 135 (GND). However, due to the large dimension D 120 of the drift region, e.g., 5 μm, the LDMOS may be inadvertently disabled due to parasitic bipolar action. In addition, the large dimension D 120 of the drift region also increases the size of the LDMOS device.

Thus, a need exists to provide an improved LDMOS device that offers: a) an improved technique to constrain the electric field in the drift region between the cool drain (hot voltage) and hot well (GND), and b) a reduced dimension of the drift region thereby reducing the device size.

SUMMARY OF THE INVENTION

The problems outlined above are addressed in a large part by an apparatus and method for improving LDMOS devices, as described herein. According to one form of the invention, a LDMOS device includes a gate to control the device, a drain coupled to the gate formed in a well of a first type, a source to form a current path with the drain, and a first field oxide region disposed between the gate and the drain. The gate is formed over a first portion of the well of the first type and a channel portion of the well of the second type. The LDMOS also includes a second field oxide region, which is disposed between the edges of the drain and the well of the second type. A dummy polysilicon layer, which is to formed to cover approximately one half of the second field oxide with a remaining portion of the dummy polysilicon layer covering a second portion of the well of the second type, reduces the electric field in the drift region.

According to another aspect of the invention, the method for reducing length of a drift region of the LDMOS device includes placing a conducting layer such as the dummy polysilicon layer to cover a portion of the FOX region and a portion of a hot well e.g., the P-well of the LDMOS device. The FOX region is placed between the cool drain (high voltage) of the LDMOS device and the hot P-well (GND). An electrical field, formed within the drift region that is positioned below the FOX region, is constrained due to the presence of the conducting layer. The length of the drift region is reduced due to the constrained electric field.

Other forms, as well as objects and advantages of the invention will become apparent upon reading the following detailed description and upon reference to the accompanying drawings.

BRIEF DESCRIPTION OF THE DRAWINGS

Novel features believed characteristic of the invention are set forth in the appended claims. The invention itself, however, as well as a preferred mode of use, various objectives and advantages thereof, will best be understood by reference to the following detailed description of an illustrative embodiment when read in conjunction with the accompanying drawings.

DETAILED DESCRIPTION OF AN EMBODIMENT

Figure 1:
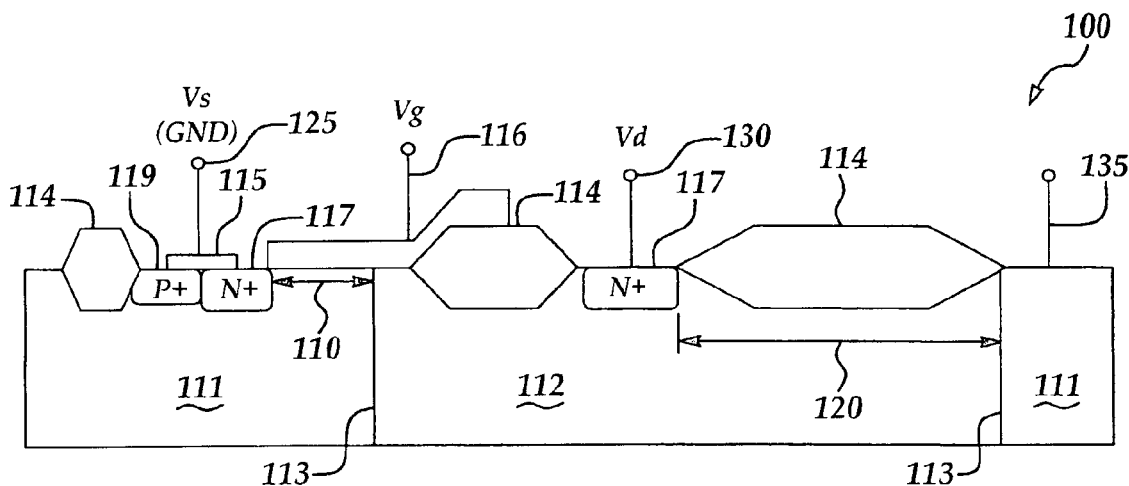
FIG. 1 is an illustrative cross-sectional diagram of a traditional LDMOS device, described herein above, according to prior art.

While the invention is susceptible to various modifications and alternative forms, specific embodiments thereof are shown by way of example in the drawings and will be described herein in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Elements, which appear in more than one figure herein, are numbered alike in the various figures. The present invention describes an apparatus and method to improve performance of a LDMOS device. According to one form of the invention, a LDMOS device includes a gate to control the device, a drain coupled to the gate formed in a well of a first type, a source to form a current path with the drain, and a first field oxide region disposed between the gate and the drain. The gate is formed over a first portion of the well of the first type and a channel portion of the well of the second type. The LDMOS also includes a second field oxide region, which is disposed between the edges of the drain and the well of the second type. A dummy polysilicon layer, which is formed to cover approximately one half of the second field oxide with a remaining portion of the dummy polysilicon layer covering a second portion of the well of the second type, reduces the electric field in the drift region.

Figure 2:
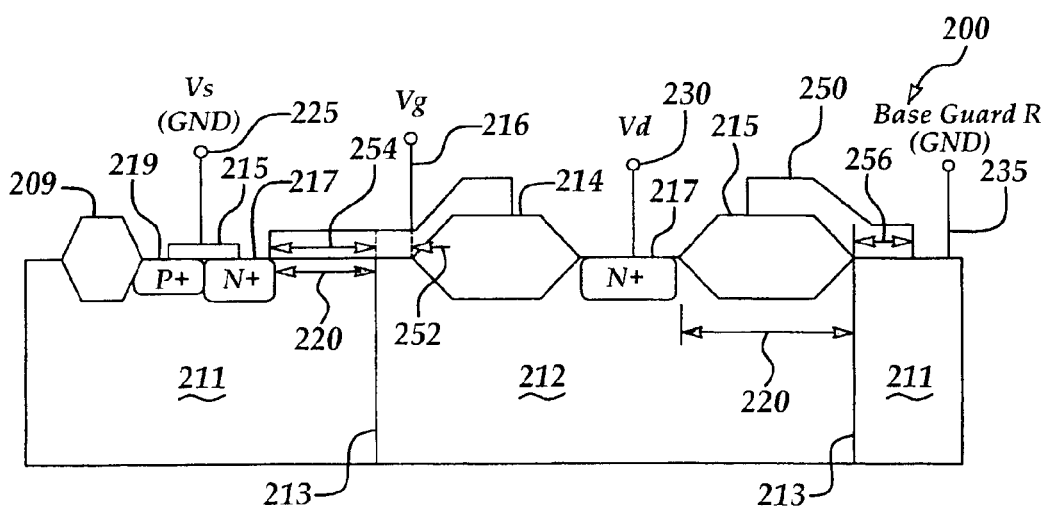
FIG. 2 is an illustrative cross-sectional diagram of an improved LDMOS device, according to an embodiment.

FIG. 2 is an illustrative cross-sectional diagram of an improved LDMOS device 200, according to an embodiment. Although the depicted embodiment illustrates the present invention more particularly within the context of a P channel LDMOS device, the present invention is also intended to include an N channel LDMOS device. All remaining semiconductor structures have a complementary polarity to their equivalent structures as illustrated within the depicted embodiment of the present invention.

The LDMOS device 200 includes a source 225, a drain 230 and a gate 216 formed within a plurality of wells. Included in the plurality of wells are a well of a first type 211, e.g., a P-well, and a well of a second type 212 opposite to the first type, e.g., a N-well. N-well 212 of silicon is isolated from P-well 211 by boundaries 213. P-well 211 extends downwards from the top surface and includes N+regions 217 whose distance L 210 from the junction between P-well 211 and N-well 212 defines the channel. The N+regions 217 provide both source 225 and drain 230 contact regions. With the application of positive voltage $V_G$ polysilicon gate 216 (beneath which is a layer of gate oxide not explicitly shown), current can flow through the channel from the source 225 into N+ 217, into P-well 211, and into N- well 212 to be collected at N+ 217 by the drain 230. Metal contact 215 shorts N+ 217 to P+ohmic contact 219. This allows source current to be applied through the P-well 211, which can then be cooled through a heat sink.

As described earlier, LDMOS structures are built on a substrate having one or more other device structures. These devices are isolated by utilizing FOX regions or shallow trench isolation (STI) regions. The role of FOX regions 209, 214 and 215 in HV applications is to decrease electric field density to improve breakdown voltage. FOX 214 is a first field oxide region disposed between the gate 216 and the drain 230. Approximately one half of the first field oxide 214 is covered by the gate 216. The gate 216 is formed over a first portion 252 of the N-well 212 and a channel portion 254 of the P-well 211. FOX 215 is a second field oxide region disposed between edges of the drain 230 and the P-well 211. A base guard ring 235 is coupled to the P-well 211. A dummy polysilicon layer 250 is formed to cover approximately one half of the second field oxide 215, with the remaining portion of the dummy polysilicon layer 250 covering a second portion 256 of the P-well 211. In one embodiment, the source 225 and the base guard ring 235 are coupled to a common ground (GND).

In the depicted embodiment, the LDMOS device 200 includes a drift region (N/P well) having a length D 220 that is required to isolate cool drain (high voltage) and hot well (GND). The drift region is positioned below the second field oxide 215. Due to the presence of the dummy polysilicon layer 250 the electric field is advantageously constrained. Additional detail of the electric field produced by LDMOS devices 100 and 200 are described in FIGS. 3 and 4. Due to a more constrained electric field, the typical value of length D 220 is advantageously reduced to 3 µm to prevent high voltage drain 230 punch through to the base guard ring 235 (GND). The shorter length D 220 of the drift region advantageously allows for a smaller size of the LDMOS device 200. In addition, the shorter length D 220 of the drift region advantageously reduces the inadvertent disabling of the LDMOS device 200 caused due to parasitic bipolar action.

In one embodiment, the shrinkage in the LDMOS device 200 size is approximately 20% compared to the LDMOS device 100 size. For example, illustrative size for the LDMOS device 100 having length D 120 equal to 5 µm is 27.2=42 µm². Equivalent size for the LDMOS device 200 having length D 220 equal to 3 µm is 23.2=40 µm², thereby generating a 20% reduction.

A computer simulation, using a commercially available simulation software program, was performed to illustrate the electric field gradients present within the drift region of the traditional LDMOS device 100 of FIG. 1 and the electric field gradients present within the drift region of the improved LDMOS device 200 of FIG. 2.

Figure 3:
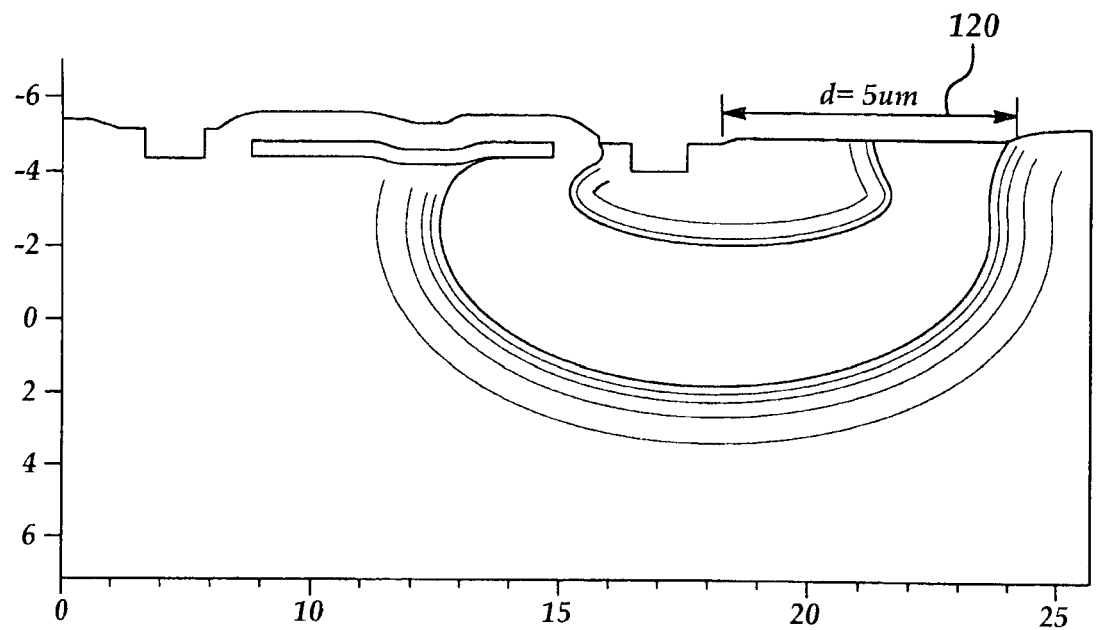
FIG. 3 illustrates, in a graphical form, electrical field gradients within a traditional LDMOS device of FIG. 1.
Figure 4:
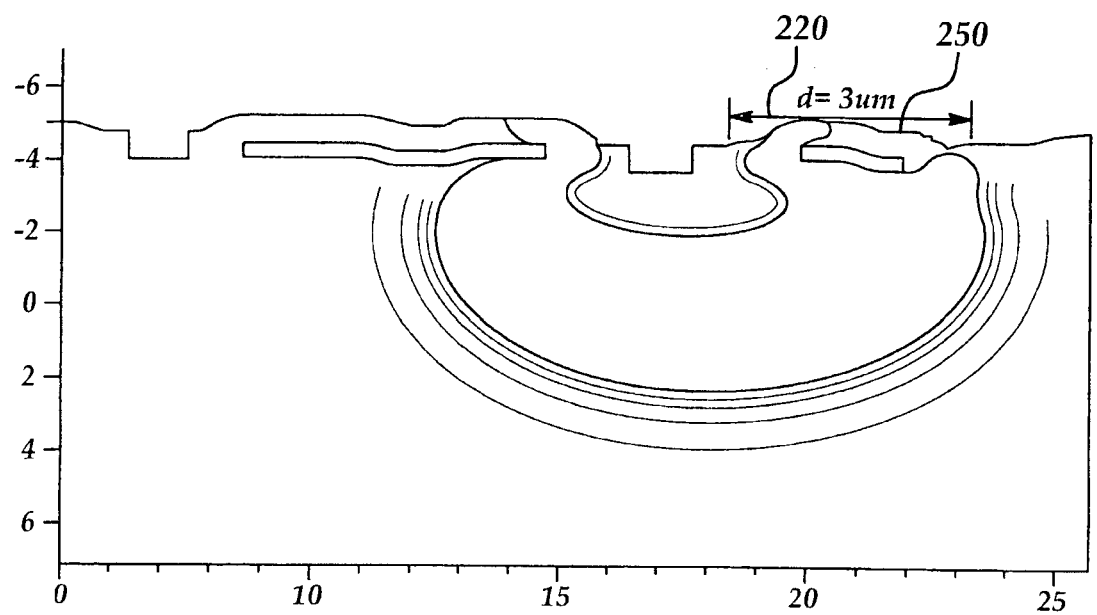
FIG. 4 illustrates, in a graphical form, electrical field gradients within an improved LDMOS device of FIG. 2, according to an embodiment.

Shown within FIG. 3 and FIG. 4 are graphical results of the computer simulation, which illustrate the characteristics of the electric field in each of the two devices. The effect of introduction of the dummy polysilicon layer 250 on the electric field is shown in FIG. 4.

As is illustrated by comparison of the graphs of FIG. 3 and FIG. 4, electric field gradients are much sharper (e.g., less rounded) and more constrained (e.g., enclosed within a smaller area) within the improved LDMOS device 200 in comparison with the corresponding electric field gradients within the LDMOS device 100. This is due to the fact that the dummy polysilicon layer 250 is a conductor of electricity and electric fields generally do not exist in conductors. Due to the more constrained electric field in FIG. 4, the length of the drift region is advantageously reduced from length D 120 approximately equal to 5 µm to length D 220 approximately equal to 3 µm.

Figure 5:
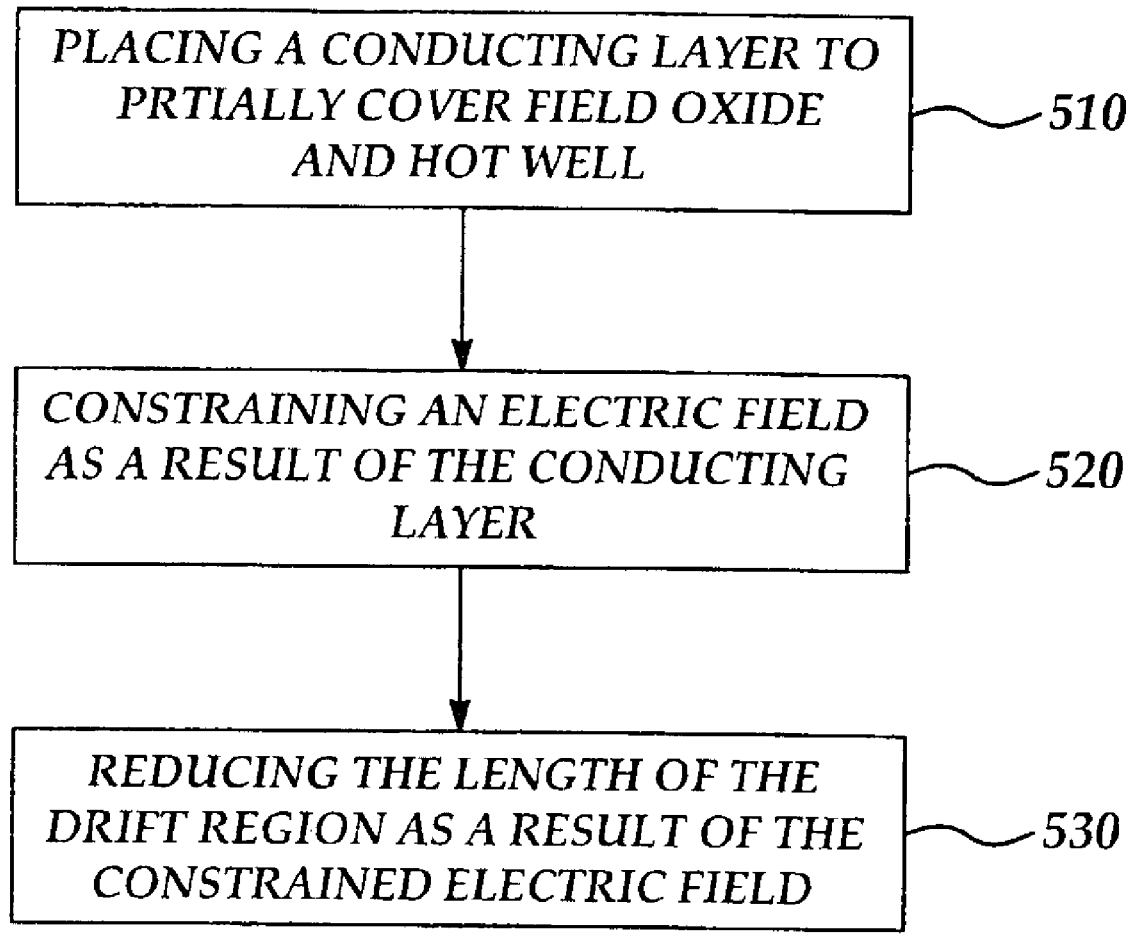
FIG. 5 is a flow chart illustrating a method for reducing length of a drift region of an improved LDMOS device of FIG. 2, according to an embodiment.

FIG. 5 is a flow chart illustrating a method for reducing length of a drift region of the LDMOS device 200, according to one embodiment. In step 510, a conducting layer such as the dummy polysilicon layer 250 is placed to cover a portion of the FOX 215 region and a portion of a hot well e.g., the P-well 211 of the LDMOS device 200. The FOX 215 is placed between the cool drain 230 of the LDMOS device and the hot P-well 211. In step 520, an electrical field, formed within the drift region that is positioned below the FOX 215, is constrained due to the presence of the conducting layer in step 510. In step 530, the length of the drift region is reduced in response to the constrained electric field. Various steps of FIG. 5 may be added, omitted, combined, altered, or performed in different orders.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for reducing length of a drift region of a metal oxide semiconductor (MOS) device, the method comprising:
   placing a conducting layer covering a portion of a field oxide (FOX) region and a portion of a hot well of the MOS device, wherein the FOX is placed between a cool drain of the MOS device and the hot well, said hot well is coupled to a base guard ring connected to ground;
   constraining an electrical field formed within a drift region, said drift region positioned below the FOX between said cool drain and said base guard ring, the constraining being caused by the placing of the conducting layer; and
   reducing the length of the drift region in response to the constraining.

2. The method of claim 1, wherein the conducting layer comprises a dummy polysilicon layer.

3. The device of claim 1, wherein said MOS device comprises laterally double diffused metal oxide semiconductor (LOMOS) device.

4. The method of claim 1, wherein the reduction in the length of the drift region causes an approximate 20 percent reduction in size of the LDMOS device.

5. The method of claim 1, wherein the LDMOS device is operable to receive high voltages varying from approximately 5V to approximately 1000V.

6. The method of claim 1, wherein the conducting layer is formed to cover approximately one half of the FOX region with a remaining portion of the conducting layer covering said hot well.

7. The method of claim 1, further comprising a source wherein the source and the base guard ring are coupled to a common ground.

8. The method of claim 1, wherein the drift region comprise an N-well and the hot well comprises a P-well.

9. The method of claim 1, wherein said conducting layer is placed on a portion of a field oxide (FOX) region and on a portion of a hot well.

10. A method for reducing length of a drift region of a metal oxide semiconductor (MOS) device, the method comprising:
    placing a conducting layer on a portion of a field oxide (FOX) region and on a portion of a hot well of the MOS device, wherein the FOX is placed between a cool drain of the MOS device and the hot well, wherein said hot well is coupled to a base guard ring connected to ground;
    constraining an electrical field formed within the drift region, said drift region positioned below the FOX between said cool drain and said base guard ring, the constraining being caused by the placing of the conducting layer; and
    reducing the length of the drift region in response to the constraining.

11. The method of claim 10, wherein the conducting layer comprises a dummy polysilicon layer.

12. The device of claim 10, wherein said MOS device comprises laterally double diffused metal oxide semiconductor (LDMOS) device.

13. The method of claim 10, wherein the reduction in the length of the drift region causes an approximate 20 percent reduction in size of the LDMOS device.

14. The method of claim 10, wherein the LDMOS device is operable to receive high voltages varying from approximately 5V to approximately 1000V.

15. The method of claim 10, wherein the conducting layer is formed to cover approximately one half of the FOX region with a remaining portion of the conducting layer covering said hot well.

16. The method of claim 10, further comprising a source wherein the source and the base guard ring are coupled to a common ground.

17. The method of claim 10, wherein the drift region comprise an N-well and the hot well comprises a P-well.

18. A method for reducing, length of a drift region of a metal oxide semiconductor (MOS) device, the method comprising:
    placing a conducting layer on a portion of a field oxide (FOX) region and on a portion of a hot well of the MOS device, wherein the FOX is placed between a cool drain of the MOS device and the hot well, wherein said hot well is coupled to a base guard ring connected to ground;
    wherein the conducting layer is formed to cover approximately one half of the FOX region with a remaining portion of the conducting layer covering said hot well.
    constraining an electrical field formed within the drift region, said drift region positioned below the FOX between said cool drain and said base guard ring, the constraining being caused by the placing of the conducting layer; and
    reducing the length of the drift region in response to the constraining.

19. The method of claim 18, wherein the conducting layer comprises a dummy polysilicon layer.

20. The device of claim 18, wherein said MOS device comprises laterally double diffused metal oxide semiconductor (LDMOS) device.

* * * * *